(12) United States Patent
Hasegawa et al.

(10) Patent No.: US 6,842,166 B2
(45) Date of Patent: Jan. 11, 2005

(54) PIEZOELECTRIC TRANSDUCER AND ELECTROPHORETIC INK DISPLAY APPARATUS USING PIEZOELECTRIC TRANSDUCER

(75) Inventors: Kazumasa Hasegawa, Nagano (JP); Tatsuya Shimoda, Nagano (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 09/975,706

(22) Filed: Oct. 11, 2001

(65) Prior Publication Data

US 2002/0011986 A1 Jan. 31, 2002

Related U.S. Application Data

(62) Division of application No. 09/494,051, filed on Jan. 28, 2000, now Pat. No. 6,373,461.

(30) Foreign Application Priority Data

Jan. 29, 1999 (JP) ............................................. 11-21621
Jan. 29, 1999 (JP) ............................................. 11-21622

(51) Int. Cl.[7] ................................................ G09G 3/34
(52) U.S. Cl. ........................... 345/107; 345/80; 345/81; 345/84; 345/85; 345/108; 310/328; 310/365; 359/290; 359/295; 359/296; 428/137; 428/138
(58) Field of Search ................................ 345/80, 81, 84, 345/85, 107, 108; 359/290, 295, 296; 310/317, 318, 328, 330, 342, 363, 365; 428/137, 138

(56) References Cited

U.S. PATENT DOCUMENTS

| | | | |
|---|---|---|---|
| 3,772,874 A | | 11/1973 | Lefkowitz |
| 4,280,756 A | * | 7/1981 | Albertinetti ................. 359/295 |
| 4,811,006 A | | 3/1989 | Kuijk |

(List continued on next page.)

FOREIGN PATENT DOCUMENTS

| | | |
|---|---|---|
| EP | 08125247 | 5/1996 |
| EP | 1 030 381 A1 | 8/2000 |
| JP | 04-304685 | 10/1992 |
| JP | 9-130008 | 5/1997 |
| JP | 09162456 | 6/1997 |
| JP | 9-364453 | 7/1997 |
| JP | 10-74992 | 3/1998 |
| JP | 10-217487 | 8/1998 |
| JP | 10-264385 | 10/1998 |
| JP | 2000-196159 | 7/2000 |

OTHER PUBLICATIONS

E. Nakamura et al, "Development of Electrophoretic Display Using Microcapsulated Suspension", pp. 1014–1017, SID 98 Digest, May 17–22, 1998, Anaheim, CA.

(List continued on next page.)

Primary Examiner—Henry N. Tran
(74) Attorney, Agent, or Firm—Harness, Dickey & Pierce, P.L.C.

(57) ABSTRACT

A first electrode layer 12, a first piezoelectric film layer 13, a second electrode layer 14, a second piezoelectric film layer 15, and a third electrode layer 16 are layered in that order on a substrate 11; these are constrained so as not to expand or contract in a thickness direction and a piezoelectric transducer is constructed thereby. A plurality of gate lines 201 and 202, a plurality of data lines 203 and 204 intersecting with the gate lines, and thin film transistors 205 and 207, disposed at the intersections of the abovementioned gate lines and data lines, are established; one source-drain of the abovementioned thin film transistors is connected to the abovementioned data lines; another source-drain of the abovementioned thin film transistors is connected to the input sides of the abovementioned thin film piezoelectric transducers 208 through 210; the output sides of the abovementioned thin film piezoelectric transducers are connected to the electrodes of electrophoretic ink display elements; and an electrophoretic ink display apparatus is constructed thereby.

8 Claims, 9 Drawing Sheets

U.S. PATENT DOCUMENTS

| | | | |
|---|---|---|---|
| 5,241,236 A * | 8/1993 | Sasaki et al. | 310/328 |
| 5,243,332 A | 9/1993 | Jacobsen | |
| 5,376,857 A * | 12/1994 | Takeuchi et al. | 310/328 |
| 5,508,720 A | 4/1996 | DiSanto et al. | |
| 5,548,564 A * | 8/1996 | Smith | 367/140 |
| 5,631,463 A * | 5/1997 | Kawasaki et al. | 250/306 |
| 5,708,461 A | 1/1998 | Kent | |
| 5,828,160 A * | 10/1998 | Sugishita | 310/366 |
| 5,880,411 A | 3/1999 | Gillespie et al. | |
| 6,008,565 A * | 12/1999 | Inoi et al. | 310/366 |
| 6,118,426 A * | 9/2000 | Albert et al. | 315/150 |
| 6,130,773 A | 10/2000 | Jacobsen et al. | |
| 6,177,921 B1 * | 1/2001 | Comiskey et al. | 345/107 |
| 6,184,856 B1 | 2/2001 | Gordon, II et al. | |
| 6,217,979 B1 * | 4/2001 | Takeuchi et al. | 310/324 |
| 6,222,513 B1 * | 4/2001 | Howard et al. | 345/107 |
| 6,229,247 B1 * | 5/2001 | Bishop | 310/328 |
| 6,232,950 B1 * | 5/2001 | Albert et al. | 345/107 |
| 6,252,564 B1 * | 6/2001 | Albert et al. | 345/1.3 |
| 6,291,925 B1 * | 9/2001 | Jacobson | 310/318 |

OTHER PUBLICATIONS

P. Drazic, B. Comiskey, J.D. Albert, L. Zhang, A. Loxley, R. Feeney, J. Jacobsen, "44.31: A: Printed and Rollable Bistable Electronic Display", SID 98 Digest, 1998, pp. 1131–1134.

Y. Chen et al, "A Conformable Electronic Ink Display Using A Foil–Based a–Si TFT Array", Technical Paper, pp. 157–159, SID 01 Digest, Jun. 3–8, 2001, San Jose, CA.

J. Hou et al, "Active Matrix Electrophoretic Displays Containing Black and White Particles with Opposite Polarities", pp. 164–167, SID Digest, Jun. 3–8, 2001, San Jose, CA.

* cited by examiner

PIEZOELECTRIC TRANSDUCER AND ELECTROPHORETIC INK DISPLAY APPARATUS USING PIEZOELECTRIC TRANSDUCER

CROSS REFERENCE TO RELATED APPLICATIONS

This application is a divisional application of application Ser. No. 09/494,051, filed Jan. 28, 2000, now U.S. Pat. No. 6,373,461.

BACKGROUND OF THE INVENTION

1. Field of the Invention

The present invention relates to a piezoelectric transducer using a piezoelectric element, and more particularly to an electrophoretic ink display apparatus using a piezoelectric transducer.

2. Description of the Related Art

The technology noted in Japanese Patent Laid-open Publication No.(Hei)8-125247 and Japanese Patent Laid-open Publication No.(Hei)9-162456 relates to conventional piezoelectric transducers. The embodiments therein are different, but both include technology using bulk piezoelectric ceramics.

Meanwhile, the paper in SID 98 Digest pp. 1131 to 1134 makes note of conventional electrophoretic ink display apparatuses. The constitution of a segment type display body using electrophoretic ink is disclosed in this paper.

In this electrophoretic ink display apparatus, each segment of the display apparatus is constituted of a plurality of microcapsules using electrophoresis. This is so that the color of a segment changes when voltage is applied to that segment.

However, the abovementioned background art has the following problems.

In the piezoelectric transducers noted in Japanese Patent Laid-open Publication No.(Hei)8-125247 and Japanese Patent Laid-open Publication No.(Hei)9-162456, bulk piezoelectric ceramics are used although the embodiments are different, as discussed above. It is difficult to miniaturize a piezoelectric transducer wherein bulk piezoelectric ceramics are used. For example, the piezoelectric transducer in Japanese Patent Laid-open Publication No. 9-162456 is 40 mm×10 mm×1.5 mm.

Also, while the constitution of a display body using piezoelectric ink is disclosed in SID 98 Digest pp. 1131 to 1134, methods for disposing a large number of these display elements at a high density and methods for driving electrophoretic ink display elements disposed at a high density are not proposed.

SUMMARY OF THE INVENTION

The present invention was made in view of the abovementioned problems with the background art and it is an object of the present invention to realize piezoelectric transducers that can be easily miniaturized.

It is another object of the present invention to realize an electrophoretic ink display apparatus comprising electrophoretic ink display elements, a plurality of which are disposed at a high density.

The piezoelectric transducer relating to the present invention comprises a first electrode layer, a first piezoelectric film layer, a second electrode layer, a second piezoelectric film layer, and a third electrode layer, layered in that order on a substrate. The abovementioned first and second piezoelectric film layers are constrained so as not to expand or contract in a thickness direction.

With the abovementioned constitution, three-dimensional and planar miniaturization are possible because the piezoelectric transducer can be constituted by forming two piezoelectric film layers. Moreover, it becomes possible to realize a piezoelectric transducer that can withdraw a high load. Also, because the piezoelectric film layers are constrained so as not to expand or contract in a thickness direction, it becomes possible to realize a piezoelectric transducer with which direct voltage amplification is possible.

In the piezoelectric transducer relating to the present invention, a first electrode layer, a piezoelectric film layer, a second electrode layer, and third electrode layer are formed on a supporting base wherein a cavity is formed. The abovementioned second electrode layer and third electrode layer are formed in a pair, with an interval therebetween, on the piezoelectric film layer positioned above the abovementioned cavity.

With the abovementioned constitution, it is possible to form a miniaturized piezoelectric transducer.

The electrophoretic ink display apparatus relating to the present invention comprises a multiplicity of capsules. Comprising a plurality of electrophoretic ink display elements wherein the color changes with the movement of charged particles within the capsules, an electrophoretic ink display apparatus further comprises a plurality of gate lines, a plurality data lines intersecting with the gate lines, and thin film transistors disposed at the intersections of the abovementioned gate lines and data lines. One source-drain of the abovementioned thin film transistors is connected to the abovementioned data line; another source-drain of the abovementioned thin film transistors is connected to the input side of the piezoelectric transducer; and the output side of the abovementioned piezoelectric transducer is connected to the electrode of the electrophoretic ink display element.

The piezoelectric transducer relating to the present invention can be used as the abovementioned piezoelectric transducer. In that case, a columnar structure is established on the upper portion of the abovementioned piezoelectric transducer and the abovementioned columnar structure is pressed with the facing substrate on which the upper electrode of the abovementioned electrophoretic ink display element is established. The abovementioned first and second piezoelectric film layers can thereby be constrained so as not to expand or contract in a thickness direction.

With the abovementioned constitution, a multiplicity of disposed electrophoretic ink display elements can be driven with piezoelectric transducers while being addressed with thin film transistors.

DESCRIPTION OF THE PREFERRED EMBODIMENTS

Embodiments of the piezoelectric transducer relating to the present invention are explained below with reference to the figures.

First Embodiment of Piezoelectric Transducer

Figure 1:
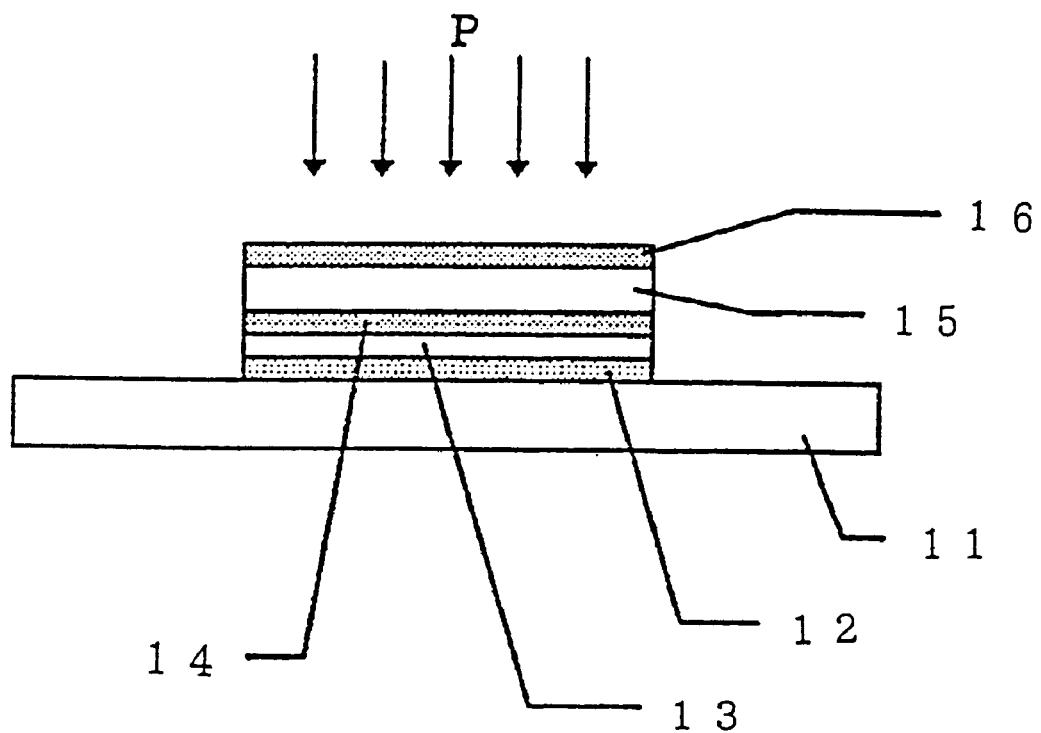
FIG. 1 is a cross sectional view of a layered thin film piezoelectric transducer relating to an embodiment of the present invention.

FIG. 1 is a cross sectional view of a layered thin film piezoelectric transducer relating to an embodiment of the present invention. A first electrode layer 12, a first piezoelectric film layer 13, a second electrode layer 14, a second piezoelectric film layer 15, and a third electrode layer 16 are formed in that order on a substrate 11. Pressure P is applied from above to the third electrode layer 16 and the first and second piezoelectric film layers 13 and 15 are constrained so as not to expand or contract in a thickness direction.

A single crystal silicon substrate, including a silicon dioxide film formed by thermal oxidation, was used as the substrate 11. The first electrode layer thereon is an electrode layer comprising three layers of titanium, platinum, and titanium in that order formed by sputtering to thicknesses of 20 nm, 200 nm, and 5 nm respectively. The first piezoelectric film layer 13 is a thin film of lead zirconate titanate (hereinafter, to be referred to as "PZT"), with a constitution of 52 mole % lead zirconate-48 mole % lead titanate, formed by the sol gel method to a thickness of 200 nm. Furthermore, the second electrode layer 14 is an electrode layer comprising three layers of titanium, platinum, and titanium in that order formed by sputtering to thicknesses of 20 nm, 200 nm, and 5 nm respectively. The second piezoelectric film layer 15 is a PZT thin film with the abovementioned constitution formed by the sol gel method to a thickness of 2 μm. Furthermore, the third electrode layer 16 is an electrode layer comprising two layers of titanium and platinum in that order formed by sputtering to thicknesses of 20 nm and 200 nm respectively.

The pressure raising action for the layered thin film piezoelectric transducer is as follows. The second electrode layer 14 becomes the ground potential. When an electric field $E_1$ is applied in the film thickness direction of the first piezoelectric film layer 13, the stress $T_1$ in the film thickness direction in the first piezoelectric film layer 13 becomes as follows, where the piezoelectric strain constant is $d_{ij}$ and the elastic compliance under an applied electric field 0 is $S_{ij}^E$.

$$T_1 = -(d_{33}/s_{33}^E) \cdot E_1 \quad (1)$$

This layered thin film piezoelectric transducer is constrained from above and an electrode of sufficiently hard metal is used; the stress $T_2$ in the film thickness direction applied to the second piezoelectric film layer therefore becomes as follows.

$$T_2 = T_1 \quad (2)$$

At this time, the electric field $E_2$ occurring in the film thickness direction of the second piezoelectric film layer 15 becomes as follows, where the permittivity at stress 0 is $\epsilon_{ij}^T$.

$$E_2 = -(d_{33}/\epsilon_{33}^T) \cdot T_2 \quad (3)$$

Equations (1) and (2) are substituted into equation (3) as follows.

$$E_2 = (d_{33}^2/(\epsilon_{33}^T \cdot s_{33}^E)) \cdot E_1 = k_{33}^2 \cdot E_1 \quad (4)$$

Here, $k_{ij}$ is the electromechanical coupling factor of the piezoelectric film layer. The following results where the voltage applied in the film thickness direction of the first piezoelectric film layer 13, meaning between the first electrode layer 12 and the second electrode layer 14, is $V_1$ and the thickness of the first piezoelectric film layer 13 is $t_1$.

$$E_1 = V_1/t_1 \quad (5)$$

The following results where the voltage output in a thickness direction of the second piezoelectric film layer 15, meaning between the second electrode layer 14 and third electrode layer 16, is $V_2$ and the thickness of the second piezoelectric film layer 15 is $t_2$.

$$E_2 = V_2/t_2 \quad (6)$$

Equations (4), (5), and (6) yield the following.

$$V_2 = k_{33}^2 \cdot V_1 \cdot t_2/t_1 \quad (7)$$

In other words, when a voltage $V_1$ is applied to the first piezoelectric film layer, the voltage $V_2$ output by the second piezoelectric film layer is proportional to the square of the electromechanical coupling constant $k_{33}$ and the ratio of the thicknesses of the two piezoelectric film layers. Specifically, the direct voltage amplification factor can be determined with the ratio of the thickness of the first piezoelectric film layer and the thickness of the second piezoelectric film layer.

The layered thin film piezoelectric transducer in the constitution of the present embodiment comprises a piezoelectric transducer formed of two piezoelectric film layers; as a result, a piezoelectric transducer for which three-dimensional and planar miniaturization are possible is realized. A high load can be withdrawn because of the use of the capacitance of the piezoelectric thin film on the output side as well. Also, direct voltage amplification is possible because the piezoelectric film layers are constrained so as not to expand or contract in a thickness direction, and because of the use of pressure to the piezoelectric thin film from the static piezoelectric effect. Actually, the inventors were able to attain pulses with an amplitude of 45 V as $V_2$ in the case where pulses with an amplitude of 10 V were applied as $V_1 \cdot k_{33}$ of the PZT film, used as the piezoelectric thin film in the present embodiment, was estimated from the inversion of equation (7) to be about 0.67.

Also, the layered thin film piezoelectric transducer in the abovementioned constitution has sufficient adhesive force between the substrate and electrode layer and between the electrode layer and piezoelectric film layers, because the electrode layers are formed with a multilayered structure of platinum and titanium. Also, the two piezoelectric film layers are formed of PZT. A layered thin film piezoelectric transducer having a large voltage amplification factor is realized because PZT has a relatively high electromechanical coupling factor. This material used in the piezoelectric film layers may also be a PZT piezoelectric material, such as PZT including lead magnesium niobate (PMN), having an even larger electromechanical coupling factor. The layered thin film piezoelectric transducer may also be constituted using material generating a large pressure in the first piezoelectric film layer 13, and material generating a large voltage relative to the applied pressure in the second piezoelectric film layer 15.

Second Embodiment of Piezoelectric Transducer

Figure 2:
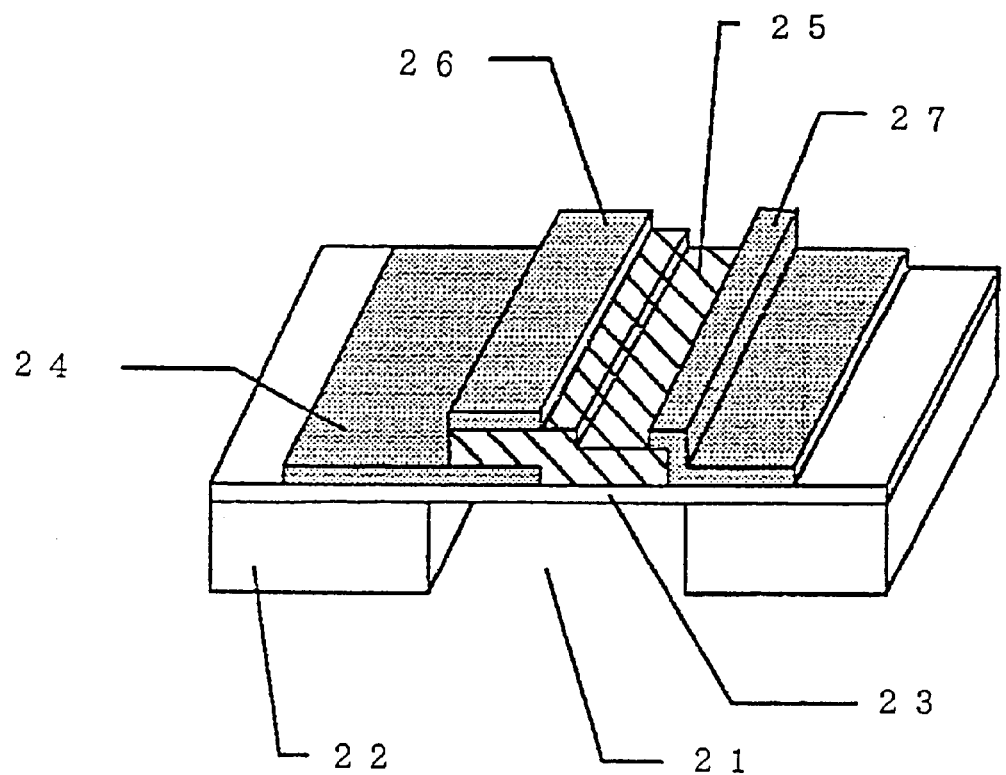
FIG. 2 is a perspective view of a thin film piezoelectric transducer constituted of Rosen piezoelectric transducers using piezoelectric thin films, relating to an embodiment of the present invention.

FIG. 2 is a perspective view of a thin film piezoelectric transducer constituted of Rosen piezoelectric transducers using piezoelectric thin films, relating to an embodiment of the present invention. A diaphragm 23, first electrode layer 24, piezoelectric film layer 25, second electrode layer 26, and third electrode layer 27 are formed on a supporting base 22 wherein a cavity 21 is formed. The second electrode layer 26 and third electrode layer 27 are formed in a pair, with an interval therebetween, on the piezoelectric film layer positioned above the cavity 21. Also, the third electrode layer 27 is formed to span the end surface and top layer surface of the piezoelectric film layer 25.

A single crystal silicon substrate with a silicon dioxide film formed by thermal oxidation was used as the base 22. A zirconia film was formed thereon as the diaphragm 23, to a thickness of 500 nm, by growing a film of metallic zirconium by sputtering and then thermal oxidation. An electrode layer comprising three layers of titanium, platinum, and titanium in that order was formed thereon as the first electrode layer 24, by sputtering and then patterning [the materials] to thicknesses of 20 nm, 200 nm, and 5 nm respectively. Then a PZT film, comprising 52 mole % lead zirconate-48 mole % lead titanate, was formed as the piezoelectric film layer 25, by the sol gel method and then patterning. Furthermore, electrode layers comprising two layers of titanium and platinum in that order were formed as the second electrode layer 26 and third electrode layer 27, by sputtering and then patterning to thicknesses of 20 nm and 200 nm respectively. A Rosen thin film piezoelectric transducer was then formed by forming a cavity 21 by anisotropic etching of a single crystal silicon substrate 22 with a dry etching method.

The operation of this Rosen thin film piezoelectric transducer is as discussed in Piezoelectric Actuators and Ultrasonic Motors (Kluwer Academic Publishers), 1997, pp. 309–310, by Kenji Uchino; the voltage amplification factor r is expressed with the following equation.

$$r = (4/l^2) \cdot k_{31} \cdot k_{33} \cdot Q_m \cdot (L_2/t) \cdot [2 \cdot (s_{33}^E/s_{11}^E)^{1/2} / \{1 + (s_{33}^D/s_{11}^E)^{1/2}\}]$$

Alternating voltage is applied between the first electrode layer 24 and the second electrode layer 26 and amplified voltage is output from between the first electrode layer 24 and third electrode layer 27.

Here, $k_{ij}$ is the electromechanical coupling factor of the piezoelectric film layer 25; $Q_m$ is the mechanical Q of the piezoelectric film layer 25; $L_2$ is the interval between the pair of second electrode layers 26 and 27; t is the thickness of the piezoelectric film layer 25; $s_{ij}^E$ is the elastic compliance at an electrical field 0; and $s_{ij}^D$ is the elastic compliance at an electric flux density 0. For example, in the case of 52 mole % lead zirconate-48 mole % lead titanate PZT, $k_{31}$=0.313, $k_{33}$=0.670, $Q_m$=860, $s_{33}^E$=17.1×10$^{-12}$ m$^2$/N, $s_{11}^E$=13.8×10$^{-12}$ m$^2$/N, and $s_{33}^D$=9.35×10$^{-12}$ m$^2$/N. When $L_2$=1 μm and t=200 nm, a very high voltage amplification factor r=450 can be attained.

Because of the use of piezoelectric thin films, three-dimensional and planar miniaturization are possible for the thin film piezoelectric transducer in the constitution of the present embodiment. For example, in the case of the abovementioned embodiment, the interval between the second electrode layers 26 and 27 is 1 μm. Also, a piezoelectric transducer can be constituted in a smaller planar region due to one of the second electrode layers 27 spanning the end surface of the piezoelectric film layer 25. Because a single crystal silicon substrate is used for the supporting base 22, a cavity 21 can be easily formed by anisotropic etching. Also, because the diaphragm 23 is formed with a zirconia thin film, a diaphragm with toughness and which is not easily broken under residual stress can be formed. Because the first electrode layer 24, second electrode layer 26, and third electrode layer 27 are formed with a multilayered structure of platinum and titanium, there is sufficient adhesive force between the diaphragm and first electrode layer, and between the piezoelectric thin films and first, second, and third electrode layers. Forming the piezoelectric film layer 25 with a PZT thin film makes it possible to form a thin film having a high electromechanical coupling factor, and a thin film piezoelectric transducer having a high voltage amplification factor can be realized. The material used in the piezoelectric film layer 25 may also be a PZT piezoelectric material, such as PZT including PMN, that has an even higher electromechanical coupling constant.

Principle of an Electrophoretic Ink Display Element

Figure 3A:
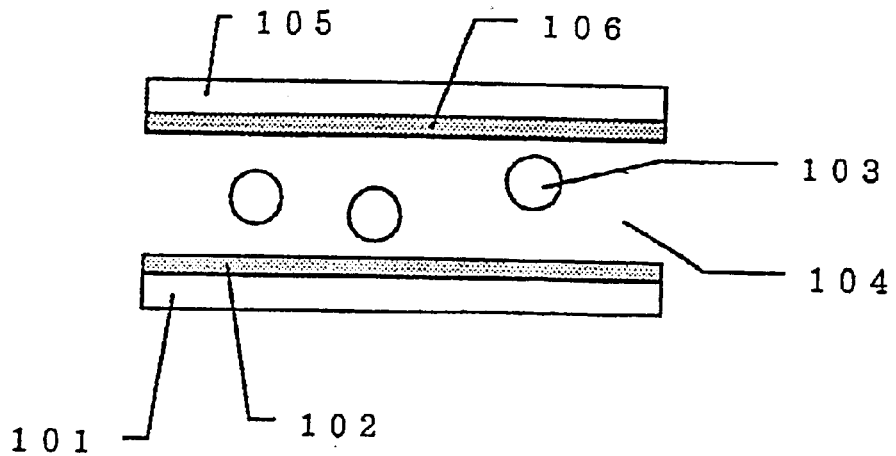
FIG. 3 shows the constitution of an electrophoretic ink display element; 3A is a cross sectional view of an electrophoretic ink display element; 3B shows the constitution of a microcapsule in an electrophoretic ink display element; and 3C shows the constitution of a charged particle in a microcapsule.

An electrophoretic ink display element is explained next. FIG. 3 shows the constitution of an electrophoretic ink display element; 3A is a cross sectional view of an electrophoretic ink display element; 3B shows the constitution of a microcapsule in an electrophoretic ink display element; and 3C shows the constitution of a charged particle in a microcapsule.

This electrophoretic ink display element comprises the following: a lower electrode 102 formed on a substrate 101, an electrophoretic ink layer comprising a binder 104 having light transmission properties and a plurality of microcapsules 103 uniformly dispersed and affixed in this binder 104, an opposite substrate 105, and a transparent electrode 106 formed on the opposite substrate.

This electrophoretic ink display element is a display element wherein the writing and deleting of display patterns can be accomplished using the electrophoresis of charged particles. The thickness of the electrophoretic ink layer, meaning the distance between the lower electrode 102 and the transparent electrode 106, is preferably about 1.5 to 2 times the outer diameter of the microcapsules 103. Also, polyvinyl alcohol, for example, can be used as the binder 104.

Figure 3B:
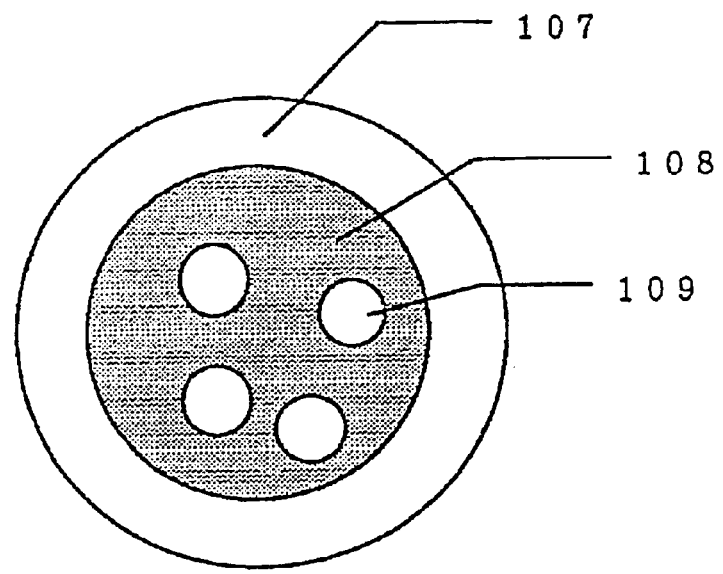
Figure 3C:
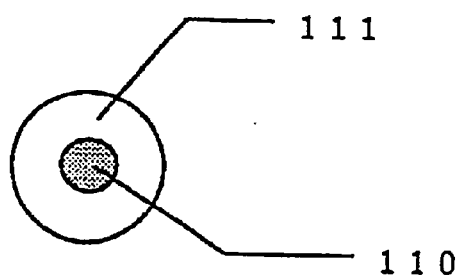

As shown in FIG. 3B, the microcapsules 103 include hollow, spherical capsules 107 having light transmitting properties. These capsules 107 are filled with liquid 108; a plurality of negatively charged particles 109 are dispersed in this liquid 108. As shown in FIG. 3C, the charged particles 109 comprise a nucleus 110 and a coating layer 111 covering this nucleus.

The colors of the charged particles 109 and the liquid 108 are different from each other. For example, the color of the charged particles 109 is white and the color of the liquid 108 is blue, red, green, or black. When an external electric field is applied to the microcapsules 103, the charged particles 109 move within the capsules 107 in a direction opposite to the abovementioned electric field. For example, when a voltage is applied so that the transparent electrode 106 has a positive potential and the lower electrode 102 has zero potential in FIG. 3A, the electric field is generated from the transparent electrode 106 toward the lower electrode 102; as a result, the charged particles 109 in the microcapsules 103 move toward the tops of the capsules 107. Consequently, the color seen from the opposite substrate 105 becomes white, because the color of the charged particles 109 can be seen. Oppositely, when a voltage is applied so that the transparent electrode 106 has negative potential and the lower electrode 102 has zero potential, the electric field is generated from the lower electrode 102 toward the transparent electrode 106; as a result, the charged particles 109 in the microcapsules 103 move towards the bottoms of the capsules. Consequently, the color seen from the opposite substrate 105 becomes the color of the liquid 108, blue for example if the color of the liquid 108 is blue.

The microcapsules 103 are constituted so that the specific gravity of the liquid 108 is equal to that of the charged particles 109. Accordingly the charged particles 109 can remain for a long period of time in the same position even if the external electric field is removed. In other words, the display of the electrophoretic ink display elements is maintained for a long period of time. Moreover, the thickness of the coating layer 111, for example, may be adjusted so that the specific gravity of the liquid 108 is equal to that of the charged particles 109. The outer diameter of the microcapsules 103 is preferably no more than 180 µm, and more preferably 10 to 20 µm. A rutile structure of titania, for example, can be used as the nucleus 110 of the abovementioned charged particles 109. Also, polyethylene, for example, can be used as the coating layer 111 of the abovementioned charged particles 109. Anthraquinone dye dissolved in ethylene tetrachloride and isoparaffin, for example, can be used as the abovementioned liquid 108.

Embodiments of the electrophoretic ink display element relating to the present invention is explained below with reference to the figures.

First Embodiment of the Electrophoretic Ink Display Apparatus

Figure 4:
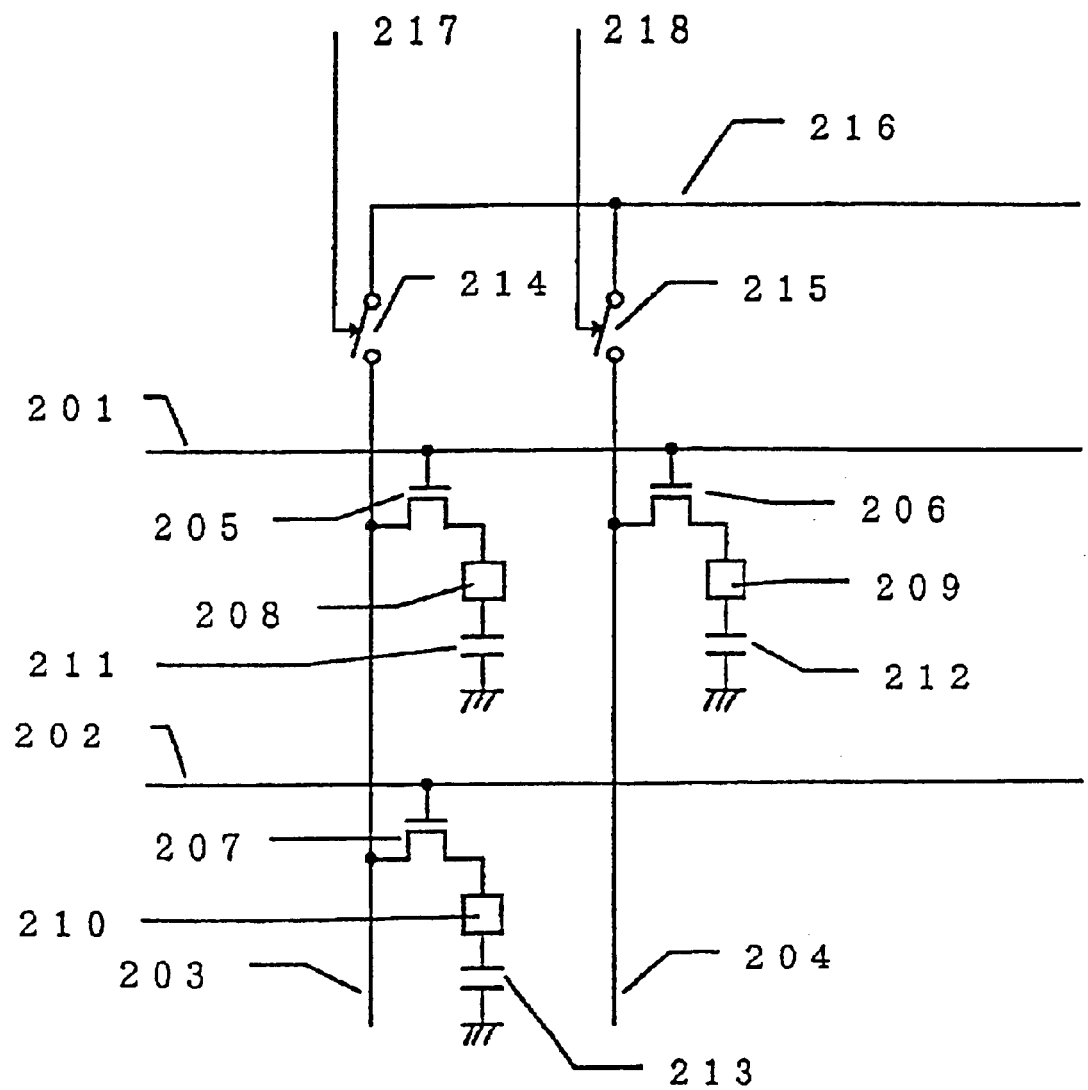
FIG. 4 shows the constitution of an electrophoretic ink display apparatus using thin film, layered piezoelectric transducer, relating to an embodiment of the present invention.

FIG. 4 shows the constitution of an electrophoretic ink display apparatus using thin film layered piezoelectric transducer, relating to an embodiment of the present invention. In this figure, 201 and 202 show gate lines; 203 and 204 show data lines; 205 through 207 show thin film transistors (TFT); 208 through 210 show thin film piezoelectric transducers; 211 through 213 show electrophoretic ink display elements; 214 and 215 show analog switches; 216 shows a data signal line; and 217 and 218 show the input terminals for the signal to control the opening and closing of analog switches 214 and 215, respectively. The analog switches 214 and 215 may be constituted with TFTs.

Figure 5:
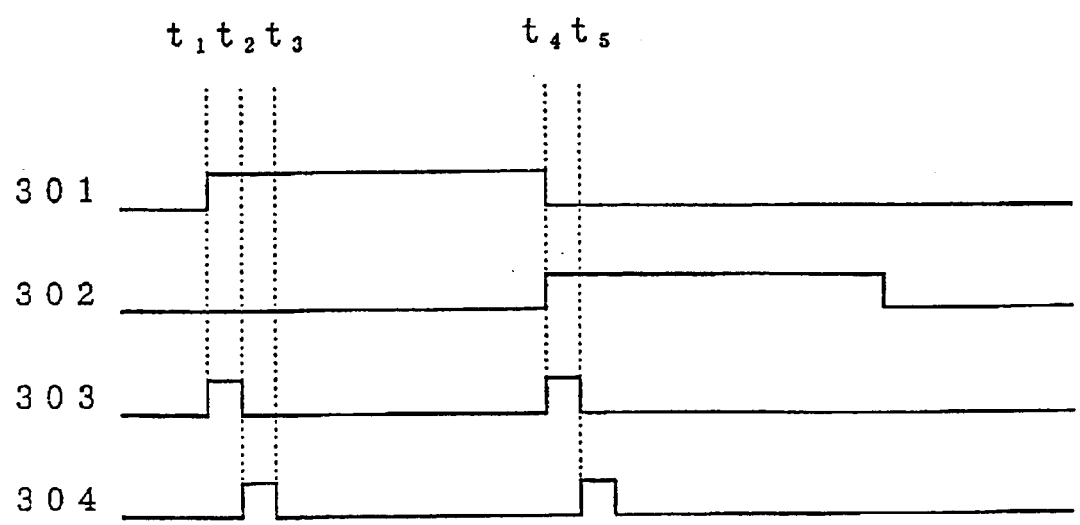
FIG. 5 is a timing chart of the electric signals controlling the TFT and the opening and closing of an analog switch in the electrophoretic ink display apparatus in an embodiment of the present invention.

FIG. 5 is a timing chart of the electric signals controlling the TFT and the opening and closing of an analog switch in the electrophoretic ink display apparatus in an embodiment of the present invention. In this figure, 301 and 302 show the electrical signals applied to the gate lines 201 and 202 respectively; and 303 and 304 show the electrical signals applied to the input terminals 217 and 218 for the signals to open and close the analog switches. The TFT and analog switches are conductive [closed] when these signals are HI. At time $t_1$, the potential of the gate line 201 becomes HI and the TFTs 205 and 206 are conductive [active]. At the same time, the potential of the input terminal 217 for the signal to open and close the analog switch 214 becomes HI and that analog switch is conductive [closed]. Consequently, the data signal supplied by the data signal line 216 is input to the thin film piezoelectric transducer 208 via the analog switch 214 and the TFT 205. The voltage amplified data signal output therefrom is then supplied to the electrode of the electrophoretic ink display element 211. At time $t_2$, the potential of the input terminal 217 for the signal to open and close the analog switch 214 becomes LOW and that analog switch becomes non-conductive [open]. At the same time, the potential of the input terminal 218 for the signal to open and close the analog switch 215 becomes HI and that analog switch is conductive [closed]. Consequently, the data signal supplied by the data signal line 216 is input to the thin film piezoelectric transducer 209 via the analog switch 215 and the TFT 206. The voltage amplified data signal output therefrom is then supplied to the electrode of the electrophoretic ink display element 212. At time $t_3$, the potential of the input terminal 218 for the signal to open and close the analog switch 215 becomes LOW and that analog switch becomes nonconductive [open]. Although not shown in FIGS. 4 and 5, the operation discussed above is repeated in the gate line direction and then at time $t_4$, the potential of the gate line 201 becomes LOW and the TFTs 205 and 206 become non-conductive [inactive]. At the same time, the potential of the gate line 202 becomes HI, the analog switch 207 becomes conductive [closed], and data are written to the electrophoretic ink display element 213 in the period from time $t_4$ to time $t_5$.

With the abovementioned constitution, it becomes possible to drive the plurality of disposed electrophoretic ink display elements with a TFT while addressing and directly amplifying a data signal with the thin film piezoelectric transducers.

The piezoelectric transducer relating to the present invention shown in FIG. 1 can be used as the thin film piezoelectric transducer in the present embodiment. In that case, the electrophoretic ink display apparatus relating to the present invention can be provided all the operative effects of the piezoelectric transducer relating to the present invention.

Figure 6:
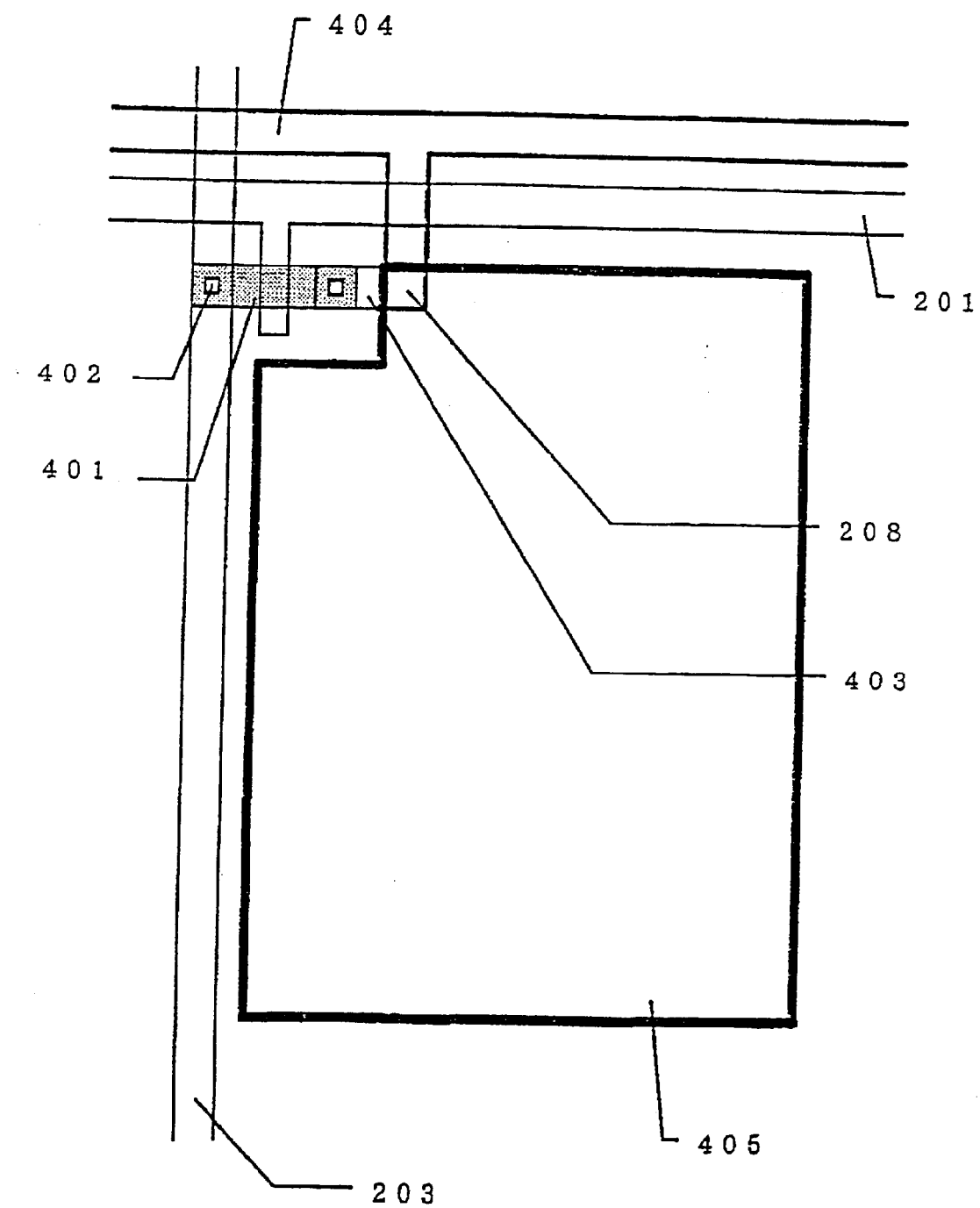
FIG. 6 is a plane diagram of one pixel in an electrophoretic ink display apparatus relating to an embodiment of the present invention.

FIG. 6 is a plane diagram of one pixel in an electrophoretic ink display apparatus relating to an embodiment of the present invention. A TFT comprising a channel portion of polycrystalline silicon film 401, a gate electrode 201, and a contact hole 402 is formed at the intersection of the gate line 201 and the data line 203. The first electrode layer 403 in the thin film piezoelectric transducer 208 also serves as the loading electrode from the source-drain portion of the TFT. The second electrode layer 404 in the thin film piezoelectric transducer 208 is drawn parallel to the gate line 201 and is grounded. The third electrode layer 405 of the thin film piezoelectric transducer 208 becomes the pixel electrode of the electrophoretic ink display element without any further changes. When the size of the pixel electrode is 150 µm square, the region required for the thin film piezoelectric transducer 208 may be about 10 µm square and an electrophoretic ink display apparatus with a compact planar form is attained.

Figure 7:
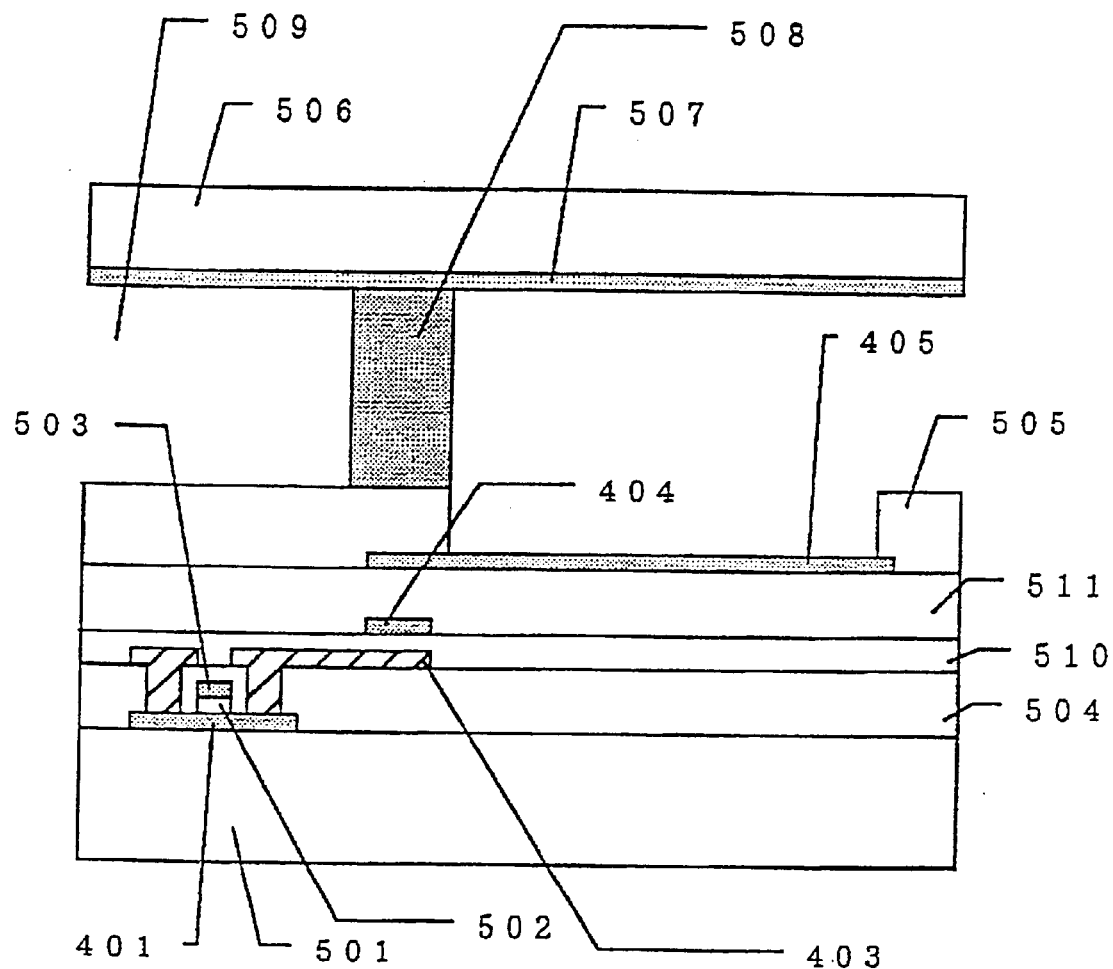
FIG. 7 is a cross sectional view of an electrophoretic ink display apparatus relating to an embodiment of the present invention.

FIG. 7 is a cross sectional view of an electrophoretic ink display apparatus relating to an embodiment of the present invention. The TFT comprises a polycrystalline silicon layer 401, gate insulating film 502, gate electrode 503, interlayer insulating film 504, and an electrode layer 403, which is a source-drain electrode and also serves as the first electrode layer of the thin film layered piezoelectric transducer, formed on an insulating substrate 501. The first piezoelectric film layer 510, second electrode layer 404, second piezoelectric film layer 511, and third electrode layer 405 are then formed, constituting the thin film layered piezoelectric transducer. A protective layer 505 is then formed. Separately therefrom, a transparent electrode 507 is formed on an opposite substrate 506; then a columnar structure 508 is formed by metal plating, or the like. The columnar structure 508 is assembled so as to press the upper portion of the thin film layered piezoelectric transducer and filled with electrophoretic ink 509; an electrophoretic ink display apparatus is formed thereby. The thin film layered piezoelectric transducer is constrained so as to be pressed on by the columnar structure 508 and opposite substrate 506; direct voltage amplification can therefore be performed. The thin film layered piezoelectric transducer with the constitution in the present embodiment is allowed three-dimensional and planar miniaturization. A high load can be withdrawn because of the use of the capacitance of the piezoelectric thin film on the output side as well. Also, direct voltage amplification is possible because of the use of pressure to the piezoelectric thin film from the static piezoelectric effect. Actually, the inventors used lead-titanate-zirconate, with a composition of 52 mole % lead zirconate-48 mole % lead titanate, for the piezoelectric film layers 510 and 511, provided the first piezoelectric film layer 510 a thickness of 200 nm and the second piezoelectric film layer 511 a thickness of 2 µm, and applied pulses with an amplitude of 10 V between the first electrode layer 403 and second electrode layer 404; in that case, pulses with an amplitude of 45 V could be attained between the third electrode layer 405 and second electrode layer 404. It thereby becomes possible to drive the electrophoretic ink display elements.

The material used in the piezoelectric film layers 510 and 511 may also be a PZT piezoelectric material, such as PZT including lead magnesium niobate (PMN), having a higher electromechanical coupling factor. A thin film piezoelectric transducer may also be constituted using a material generating high stress for the first piezoelectric film layer 103, and a material generating high voltage with respect to the applied pressure for the second piezoelectric film layer 105.

The adhesive force of the first, second, and third electrode layers with the piezoelectric thin films can be improved by forming the first electrode layer 24, second electrode layer 26, and third electrode layer 27 of a multilayered structure of platinum and titanium.

Second Embodiment of the Electrophoretic Ink Display Apparatus

Figure 8:
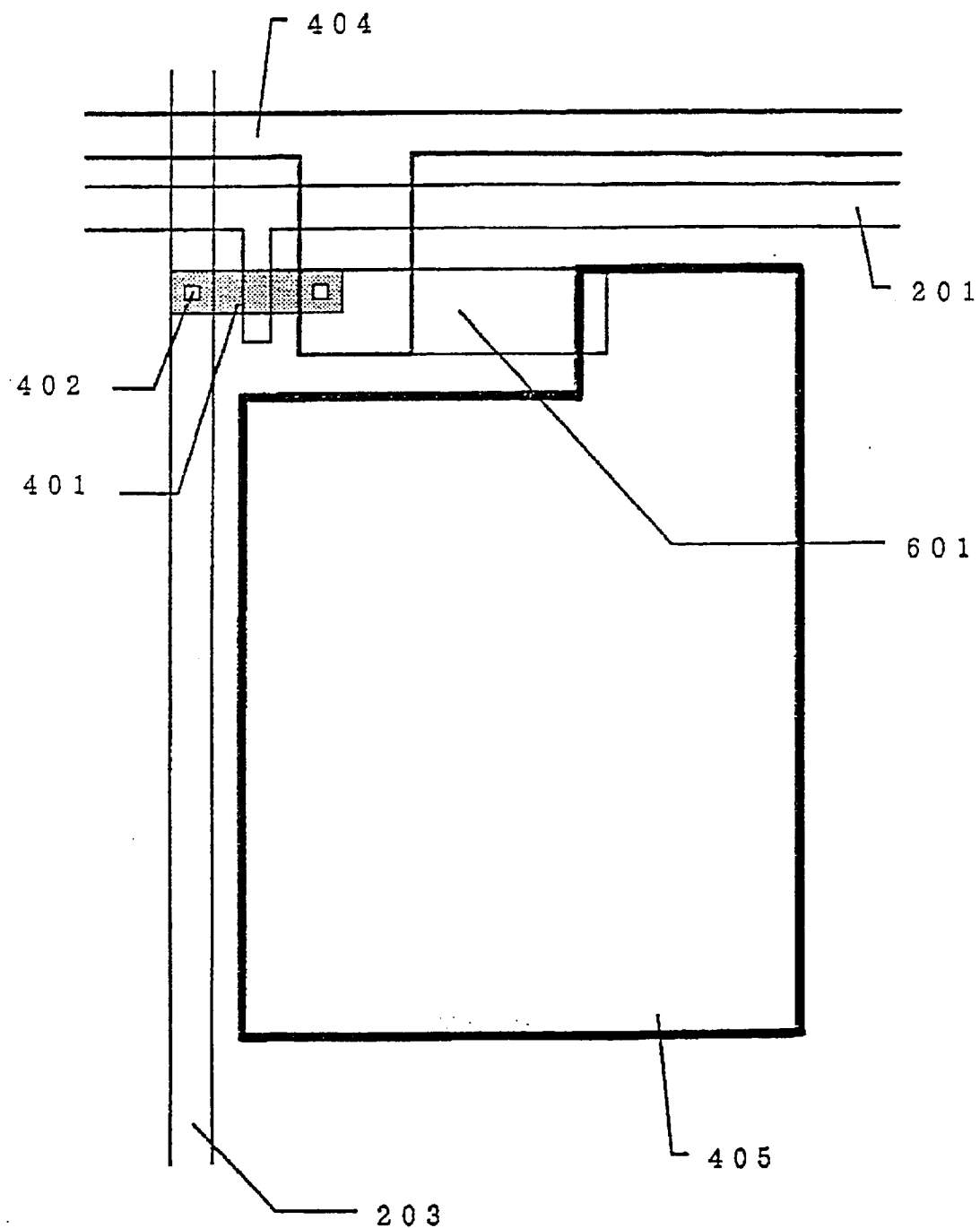
FIG. 8 is a plane diagram of one pixel in an electrophoretic ink display apparatus using Rosen thin film piezoelectric transducers, relating to an embodiment of the present invention.

FIG. 8 is a plane diagram of one pixel in an electrophoretic ink display apparatus using Rosen thin film piezoelectric transducers and relating to an embodiment of the present invention. A TFT comprising a channel portion of polycrystalline silicon thin film 401, gate electrode 201, and contact hole 402 is formed at the intersection of the gate line 201 and data line 203. 601 is a piezoelectric film layer; therebelow is a cavity to allow vibration. A common electrode layer 404 in the thin film piezoelectric transducer is drawn parallel to the gate line 201 and is grounded. 405 is a pixel electrode of the electrophoretic ink display element.

The piezoelectric transducer shown in FIG. 2 can be used as the Rosen thin film piezoelectric transducer in the present embodiment. In that case, the electrophoretic ink display apparatus relating to the present invention can be provided all the operative effects of the piezoelectric transducer relating to the present invention.

Figure 9:
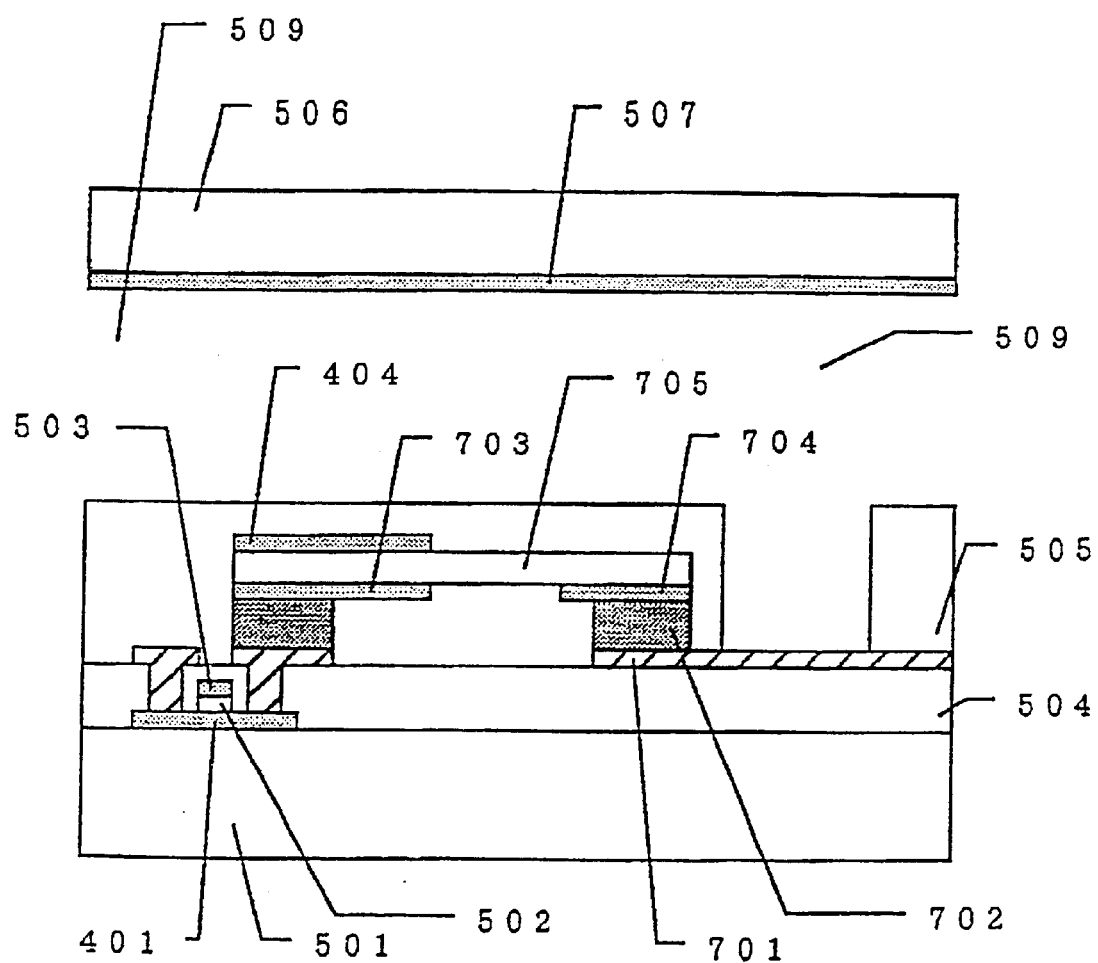
FIG. 9 is a cross sectional view of an electrophoretic ink display apparatus using Rosen thin film piezoelectric transducers, relating to an embodiment of the present invention.

FIG. 9 is a cross sectional view of an electrophoretic ink display apparatus using Rosen thin film piezoelectric transducers and relating to an embodiment of the present invention. A TFT is constituted of a polycrystalline silicon layer 401, gate insulating film 502, gate electrode 503, interlayer insulating film 504, and an electrode layer 701 which is a source-drain electrode and also serves as the lower electrode of the electrophoretic ink display element, formed on an insulating substrate 501. A bump layer 702 is then formed with metal plating. 703 is an input electrode of a Rosen thin film piezoelectric transducer; 704 is an output electrode of a Rosen thin film piezoelectric transducer; 705 is a piezoelectric film layer; and 404 is a common electrode of a Rosen thin film piezoelectric transducer. The adhesive force between the electrodes and the piezoelectric film layers can be improved by forming the electrodes 703, 704, and 404 of a multilayered structure of platinum and titanium. A thin film with a high electromechanical coupling factor can be formed by forming the piezoelectric film layer 705 with a PZT thin film. In this setup, alternating voltage is applied between the input electrode 703 and the common electrode 404, the piezoelectric film layer 705 vibrates, and alternating voltage amplified between the output electrode 704 and common electrode 404 is output. Such a structure can be formed by forming a piezoelectric film layer 705, electrodes 703, 704, 404, and so forth on a separate substrate in advance, connecting a bump layer 702 and electrode layers 703 and 704, then peeling away the separate substrate. Furthermore, an electrophoretic ink display apparatus is formed by forming a protective layer 505, forming separately therefrom a transparent electrode 507 on the opposite substrate 506, assembling them and injecting electrophoretic ink 509 thereinto.

Because a cavity is formed below the piezoelectric film layer 705, the piezoelectric film layer can vibrate and consequently, it can operate as a Rosen thin film piezoelectric transducer and supply a voltage amplified alternating signal to the lower electrode 701 of the electrophoretic ink display element. Even if the signal supplied to the electrode 701 is alternating, the potential of the electrode 701 can be kept constant by turning off the thin film transistor at the appropriate position in the amplitude thereof. As a result, it becomes possible to drive the electrophoretic ink display element. Also, even if the electrical signal input to the Rosen thin film piezoelectric transducer has a short waveform, [the signal] can be voltage amplified because the piezoelectric transducer is deformed by the characteristic vibration thereof.

As discussed above, the piezoelectric transducer relating to the present invention has two piezoelectric film layers constrained so as not to expand or contract in a thickness direction. Miniaturization is therefore easy and direct voltage amplification is possible.

Also, the Rosen piezoelectric transducer using the piezoelectric thin film relating to the present invention is formed using a piezoelectric thin film on a supporting base wherein a cavity is formed. Miniaturization is therefore easy and [the piezoelectric transducer] also has a high voltage amplification factor.

Also, the electrophoretic ink display element relating to the present invention can be driven by a miniaturized thin film piezoelectric transducer while being addressed with a thin film transistor. An electrophoretic ink display apparatus having a plurality of electrophoretic ink display elements disposed at a high density is therefore realized.

What is claimed is:

1. A thin film piezoelectric transducer comprising:
   a first electrode layer disposed on a substrate;
   a first piezoelectric film layer disposed on said first electrode layer;
   a second electrode layer disposed on said first piezoelectric film layer;
   a second piezoelectric film layer disposed on said second electrode layer; and
   a third electrode layer disposed on said second piezoelectric film layer, wherein said first and second piezoelectric film layers are constrained so as not to expand or contract.

2. The thin film piezoelectric transducer, according to claim 1, wherein said first, second, and third electrode layers are formed of a multilayered structure of platinum and titanium.

3. The thin film piezoelectric transducer, according to claim 1, wherein said first and second piezoelectric film layers are formed of a lead-titanate-zirconate piezoelectric material.

4. The thin film piezoelectric transducer, according to claim 1, wherein an arbitrary voltage waveform is input to said first piezoelectric film layer and said arbitrary voltage waveform which has been amplified is output to said second piezoelectric film layer.

5. A thin film piezoelectric transducer comprising:
   a substrate;
   a first electrode layer disposed on said substrate, the first electrode layer including layers of platinum and titanium;
   a first piezoelectric film layer disposed on said first electrode layer, the first piezoelectric film layer containing lead zirconate titanate;
   a second electrode layer disposed on said first piezoelectric film layer, the second electrode layer including layers of platinum and titanium;
   a second piezoelectric film layer disposed on said second electrode layer, the second piezoelectric film layer containing lead zirconate titanate; and a third electrode layer disposed on said second piezoelectric film layer, the third electrode layer including layers of platinum and titanium, wherein said first and second piezoelectric film layers are constrained to not expand to contract; and wherein upon application of a first voltage to said first piezoelectric film layer, a second voltage is output by the second piezoelectric film layer that is proportional to a square of an electromechanical coupling constant and a ratio of a thickness of the first piezoelectric film layer and a thickness of the second piezoelectric film layer.

6. A thin film piezoelectric transducer comprising:

a supporting base wherein a cavity is formed;

a diaphragm comprised of a zirconia film disposed on said supporting base;

a first electrode layer disposed on a portion of said diaphragm, the first electrode layer including layers of platinum and titanium;

a piezoelectric film layer disposed on a portion of said first electrode layer and a portion of said diaphragm, the piezoelectric film layer containing lead zirconate titanate;

a second electrode layer disposed on a portion of said piezoelectric film layer, the second electrode layer including layers of platinum and titanium; and a third electrode layer disposed on a portion of said piezoelectric film layer and a portion of said diaphragm, wherein said second electrode layer and third electrode layer are disposed as a pair with a space therebetween on the piezoelectric film layer located above said cavity;

said third electrode layer is formed to span an end surface and an upper layer surface of said piezoelectric film layer; and wherein upon application of an alternating voltage between the first electrode layer and the second electrode layer, an amplified voltage is output from between the first electrode layer and third electrode layer.

7. The thin film piezoelectric transducer according to claim 6, wherein the alternating voltage is an alternating voltage waveform.

8. A thin film piezoelectric transducer comprising:

a first electrode layer disposed on a substrate;

a first piezoelectric film layer disposed on said first electrode layer;

a second electrode layer disposed on said first piezoelectric film layer;

a second piezoelectric film layer disposed on said second electrode layer; and a third electrode layer disposed on said second piezoelectric film layer, wherein each of said first piezoelectric film layer and said second piezoelectric film layer are fully constrained so as not to expand or contract.

* * * * *

UNITED STATES PATENT AND TRADEMARK OFFICE
CERTIFICATE OF CORRECTION

PATENT NO.      : 6,842,166 B2
DATED           : January 11, 2005
INVENTOR(S)     : Kazumasa Hasegawa et al.

It is certified that error appears in the above-identified patent and that said Letters Patent is hereby corrected as shown below:

Title page,
Item [56], References Cited, FOREIGN PATENT DOCUMENTS, "JP 9-364453" should be -- JP 9-36453 -- and "JP 09162456" should be -- EP 09162456 --

Column 2,
Line 25, after "plurality" insert -- of --

Column 11,
Line 5, "to" should be -- or --

Signed and Sealed this

Twenty-sixth Day of July, 2005

JON W. DUDAS
*Director of the United States Patent and Trademark Office*